(12) United States Patent
Patterson et al.

(10) Patent No.: US 8,039,837 B2
(45) Date of Patent: Oct. 18, 2011

(54) IN-LINE VOLTAGE CONTRAST DETECTION OF PFET SILICIDE ENCROACHMENT

(75) Inventors: Oliver D. Patterson, Poughkeepsie, NY (US); Ishtiaq Ahsan, Wallkill, NY (US)

(73) Assignee: International Business Machines Corporation, Armonk, NY (US)

( * ) Notice: Subject to any disclaimer, the term of this patent is extended or adjusted under 35 U.S.C. 154(b) by 187 days.

(21) Appl. No.: 12/471,723

(22) Filed: May 26, 2009

(65) Prior Publication Data

US 2010/0301331 A1    Dec. 2, 2010

(51) Int. Cl.
  *H01L 23/58* (2006.01)
(52) U.S. Cl. .......... 257/48; 257/797; 257/E21.521; 257/E21.524; 324/762.01; 324/762.1
(58) Field of Classification Search .......... 257/48, 257/797, E21.521, E21.524; 324/762.01–762.1, 324/158; 438/18
See application file for complete search history.

(56) References Cited

U.S. PATENT DOCUMENTS

| | | | |
|---|---|---|---|
| 7,456,636 B2 | 11/2008 | Patterson et al. | |
| 2007/0221990 A1 | 9/2007 | Cote et al. | |
| 2007/0222470 A1 | 9/2007 | Patterson et al. | |
| 2007/0257317 A1* | 11/2007 | Fechner et al. | 257/351 |
| 2008/0217612 A1* | 9/2008 | Patterson et al. | 257/48 |

* cited by examiner

*Primary Examiner* — Evan Pert
*Assistant Examiner* — Scott R Wilson
(74) *Attorney, Agent, or Firm* — Howard Cohn; Ian D. MacKinnon

(57) ABSTRACT

A semiconductor test structure includes a PFET transistor, having a source region, a drain region, a gate disposed between the source region and the drain region, a body disposed under the gate, and a body contact. The source region and drain region float, and the body contact is electrically connected to the body of the PFET transistor and to the ground. This grounds the body of the PFET transistor, and the body contact of the test structure is electrically connected to a capacitor that is electrically connected to ground.

12 Claims, 4 Drawing Sheets

IN-LINE VOLTAGE CONTRAST DETECTION OF PFET SILICIDE ENCROACHMENT

FIELD OF THE INVENTION

The present invention relates generally to semiconductor fabrication and, more particularly, to test structures for detecting defects using voltage contrast inspection.

BACKGROUND OF THE INVENTION

Semiconductor devices or "ICs" (integrated circuits) have evolved from a handful of interconnected devices fabricated on a single chip of silicon to millions of devices. Current ICs provide performance and complexity far beyond what was originally imagined. In order to achieve improvements in complexity and circuit density (i.e., the number of devices capable of being packed onto a given chip area), the size of the smallest device feature, also known as the device "geometry," has become smaller with each generation of ICs. Semiconductor devices are now being fabricated with features less than 50 nanometers across.

Today's CMOS technologies utilize silicide to reduce the resistivity of the active and poly-silicon gate regions and allow ohmic contact with the interconnect metal. This silicide is susceptible to migration causing shorts between the drain, body, source and gate which effectively kill the associated device. This defect mechanism, which may be referred to as silicide encroachment, is one of the top causes of yield loss affecting the CMOS technology. Because the process sequences for forming NFETs and PFETs differ, the mechanisms for the formation of encroachment defects on each are generally quite different. Therefore it is important to be able to monitor for encroachment defects on both transistor types. Furthermore, in order to eliminate these mechanisms as quickly as possible and to promptly react to excursions, it is desirable to be able to detect these encroachment defects as early as possible in the process sequence.

Test structures which may be tested in-line, as early as the first metal level, provide a way to detect encroachment defects. However, since leakages just one thousand times greater than the leakage of a good CMOS device may be sufficient to kill a device, only small numbers of devices may be tied together and tested simultaneously. The area required for probe pads consumes much more area than the CMOS structures themselves. Since failure rates measured in the parts per billion are desired, many of these test structures are necessary to effectively monitor for encroachment defects. A second disadvantage of using probe-able test structures is that time intensive failure analysis and scrapping of the entire wafer are required to isolate the actual encroachment defect. A third disadvantage is that the structures are only tested at metal 1 or later, which is long after the encroachment defects may have formed.

In-line voltage contrast (VC) inspection is a powerful technique for detecting and isolating yield limiting defects in the semiconductor fabricating industry. VC inspection is the subject of U.S. Patent Application Publication number 20070222470 to Patterson et al., and U.S. Pat. No. 7,456,636 to Patterson et al., both of which are incorporated in their entireties herein by reference. In-line VC inspection includes scanning the wafer surface of a NFET device in which test structures exist with a scanning electron microscope (SEM). As the inspection proceeds, the SEM induces charge on all electrically floating elements whereas any grounded elements remain at zero potential. This potential difference is visible to the SEM. However, detection of encroachment defects affecting PFET devices has proven to be more challenging, due to insufficient contrast when the VC inspection is applied. Therefore, what is needed is an improved structure for VC contrast detection of PFET silicide encroachment.

SUMMARY OF THE INVENTION

A semiconductor test structure includes a PFET transistor, having a source region, a drain region, a gate disposed between the source region and the drain region, a body disposed under the gate, and a body contact. The source region and drain region float, and the body contact is electrically connected to the body of the PFET transistor, and the ground. This grounds the body of the PFET transistor, and the body contact of the test structure is electrically connected to a capacitor that is electrically connected to ground.

A semiconductor test structure includes a PFET transistor, having a source region, a drain region, a gate disposed between the source region and the drain region, a body disposed under the gate, and a body contact. The body contact is electrically connected to the body of the PFET transistor and to a sense pad, thereby electrically connecting the body of the PFET transistor to the sense pad. The drain region is electrically connected to ground and to a capacitor, and the capacitor is electrically connected to ground.

A semiconductor test structure includes a PFET transistor, having a source region, a drain region, a gate disposed between the source region and the drain region, and a body disposed under the gate. The source region is electrically connected to the gate and the drain region is electrically connected to ground. Further, the semiconductor test structure includes a sense pad having a rectangular contact that electrically connects the source region to the gate. Further included is a reference pad including a reference ground contact. The reference pad is electrically connected to the drain region, disposed within the drain region, and is electrically connected to ground. A semiconductor test structure includes a PFET transistor, having a source region, a drain region, a gate disposed between the source region and the drain region, a body disposed under the gate, and a body contact. The body contact is electrically connected to the body of the PFET transistor, and to a sense pad, thereby electrically connecting the body of the PFET transistor to the sense pad. The sense pad is exposed to a surface of the semiconductor test structure, and the source region and the drain region are both electrically connected to ground.

GLOSSARY

Body contact—a conductive member providing an electrical connection to the body of a transistor, which is the region disposed underneath the gate.

Negative Mode—the technique of negatively charging the surface of a test structure.

Positive Mode—the technique of positively charging the surface of a test structure.

SEM—Scanning Electron Microscope, a tool used to induce charge in the test structures, and perform imaging on those test structure. Voltage Contrast—A phenomenon during SEM imaging where the brightness of an electrical node is proportional to its voltage.

Voltage Contrast Inspection—The technique of scanning a semiconductor surface with a SEM with conditions that induced voltages on each electrical element depending on the capacitance and resistance to a ground. The purpose is to detect electrical abnormalities in the semiconductor.

BRIEF DESCRIPTION OF THE DRAWINGS

The structure, operation, and advantages of the present invention will become further apparent upon consideration of the following description taken in conjunction with the accompanying figures (FIGs.). The figures are intended to be illustrative, not limiting.

Certain elements in some of the figures may be omitted, or illustrated not-to-scale, for illustrative clarity. The cross-sectional views may be in the form of "slices", or "near-sighted" cross-sectional views, omitting certain background lines which would otherwise be visible in a "true" cross-sectional view, for illustrative clarity.

Often, similar elements may be referred to by similar numbers in various figures (FIGs) of the drawing, in which case typically the last two significant digits may be the same, the most significant digit being the number of the drawing figure (FIG).

FIG. 1 is a prior art test structure used for NFET evaluation.

FIG. 2 is an embodiment of a test structure in accordance with the present invention.

FIGS. 3A and 3B show an alternative embodiment of a test structure in accordance with the present invention.

FIG. 4 is an example of a voltage contrast image.

FIG. 5 is an additional alternative embodiment of the present invention.

FIG. 6 shows a view of a test array comprising a plurality of test structures in accordance with the present invention on a semiconductor wafer.

DETAILED DESCRIPTION

Figure 1:
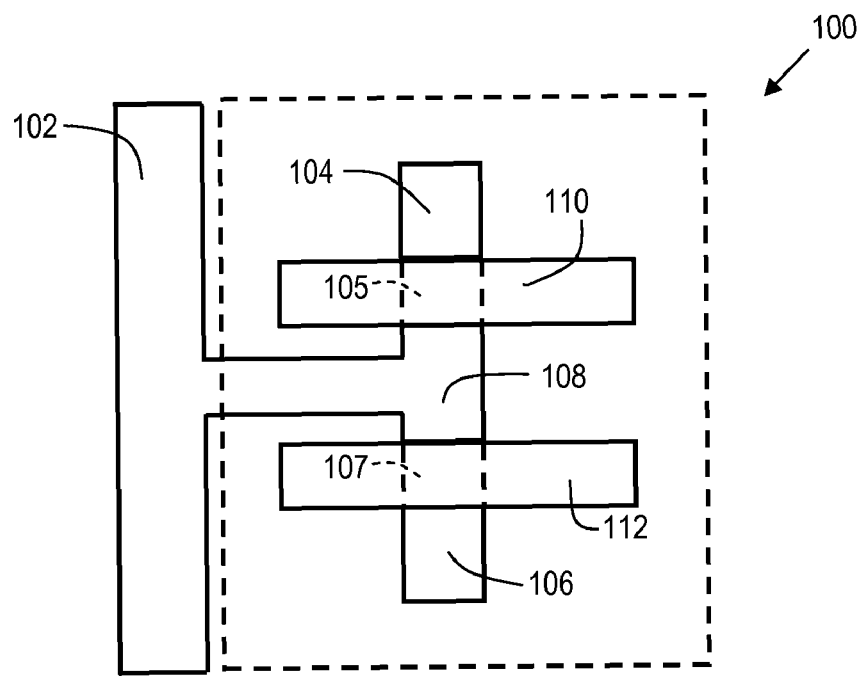

In order to provide some context for the description of embodiments of the present invention, the prior art structure of FIG. 1 will be briefly described below. FIG. 1 shows a test structure 100 which is used for NFET evaluation. The test structure 100 is comprised of N+ source regions 104 and 106, and gate stacks 110 and 112. N+ drain region 108 is disposed between gate stacks 110 and 112. Therefore, test structure 100 is essentially comprised of two NFET transistors in series, with the common drain 108 grounded via connection to ground bus 102. Therefore, the junction between N+ source region 104, and P+ region 105 (which is under gate stack 110) is an NP junction. Similarly, the junction between N+ source region 106 and P+ region 107 (which is under gate stack 112) is an NP junction.

When a SEM electron beam scans the surface of test structure 100, the primary electrons emitted by the SEM cause more secondary electrons to be ejected from the N+ source regions 104 and 106. The deficit of electrons results in source regions 104 and 106 being positively charged, which in turn causes a reverse bias at the junction between source region 104 and P+ region 105, and also causes a reverse bias between source region 106 and P+ region 107. When the SEM then acquires a VC image while the source regions are positively charged, those areas of positive charge will appear dark in the VC image, whereas any area that is grounded will appear bright in the VC image. However, in the event that an encroachment defect causes source region 104 and/or drain region 108 to be shorted to P+ region 105, the source region 104 and/or drain region 108 will then appear bright in the VC image, since it is effectively shorted to ground bus 102, and hence will not retain a positive charge. The VC images are typically analyzed by a computer system to identify any unexpected bright areas which correspond to a region that was inadvertently shorted to ground.

Figure 2:
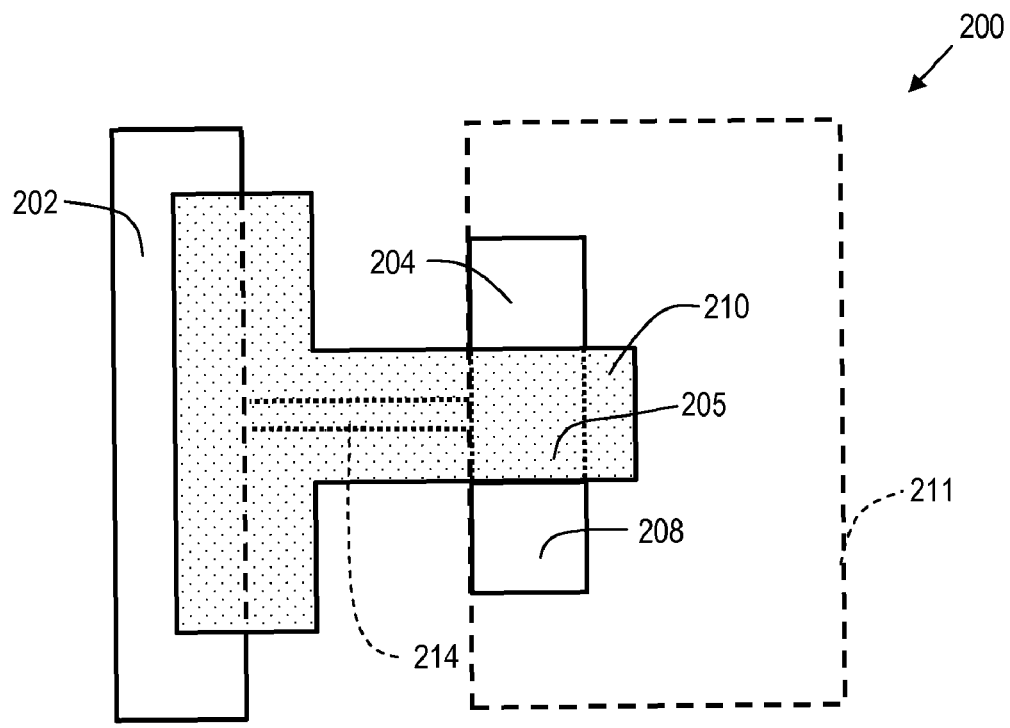

FIG. 2 is an embodiment of a test structure 200 used for PFET evaluation in accordance with the present invention. P+ source region 204 is disposed adjacent to N+ region 205 (underneath gate 210), which is in turn disposed adjacent to P+ drain region 208. N+ (N doped) region 205 is typically doped with phosphorous or arsenic, although other dopants may be used. Therefore, test structure 200 comprises a PFET transistor 211, with N+ region 205 electrically connected to ground bus 202 via body contact 214, which connects ground bus 202 to the channel ("body") 205 of the PFET transistor 211, which is a region under the gate stack 210. Therefore, the junction between P+ source region 204, and N+ region 205 (which is under gate 210) is a PN junction. P+ (P doped) regions 204 and 208 are preferably doped with boron, although other dopants, such as indium or gallium may be used. Similarly, the junction between P+ drain region 208 and N+ region 205 is a PN junction. In order to use this test structure, a "negative mode" is used. That is, instead of creating a positive charge on source region 204 and drain region 208 as was the case with FIG. 1, a negative charge is created, which in turn creates the reverse bias between the junction of source region 204 and N+ region 205, and also creates a reverse bias between drain region 208 and N+ region 205. The entire area of the test structure 200 is first implanted with an N well dopant. After formation of the gate "stack" 210, the entire area of the test structure 200 is then implanted with a P dopant. The gate stack 210 blocks the P dopants so that the silicon under gate 210 remains N doped, hence forming a PFET transistor.

The negative mode inspection may be achieved by configuring various tool conditions, such as the electron beam parameters of the SEM. For instance, if an extraction voltage isn't applied to a Wehnelt plate (used for focusing and control of the electron beam) which sits over the wafer, then beam energies greater than 2.5 keV will result in a electron yield less than 1. This causes an electron surplus that induces the negative mode conditions.

In this configuration, source 204 and drain region 208 serve as "sense pads" that are inspected using VC imaging techniques. If there is no encroachment, the sense pads (source 204 and drain region 208) will appear dark. If there is an encroachment defect, one or more of the sense pads will appear bright. This abnormal pattern is flagged by image analyzing software as a defect.

The reverse bias of the PN junctions allows the VC technique to identify defects. Without reverse bias, the sense pads would appear shorted to ground bus 202, making it difficult to distinguish between a good test structure and a defective test structure. As stated previously, to reverse bias the PFET with test structure 200, negative mode is used (i.e., the surface is charged negatively). While this structure allows the use of VC to inspect PFETs, it requires the use of negative mode. There are advantages to using positive mode, which include improved contrast on the VC images.

Figure 3A:
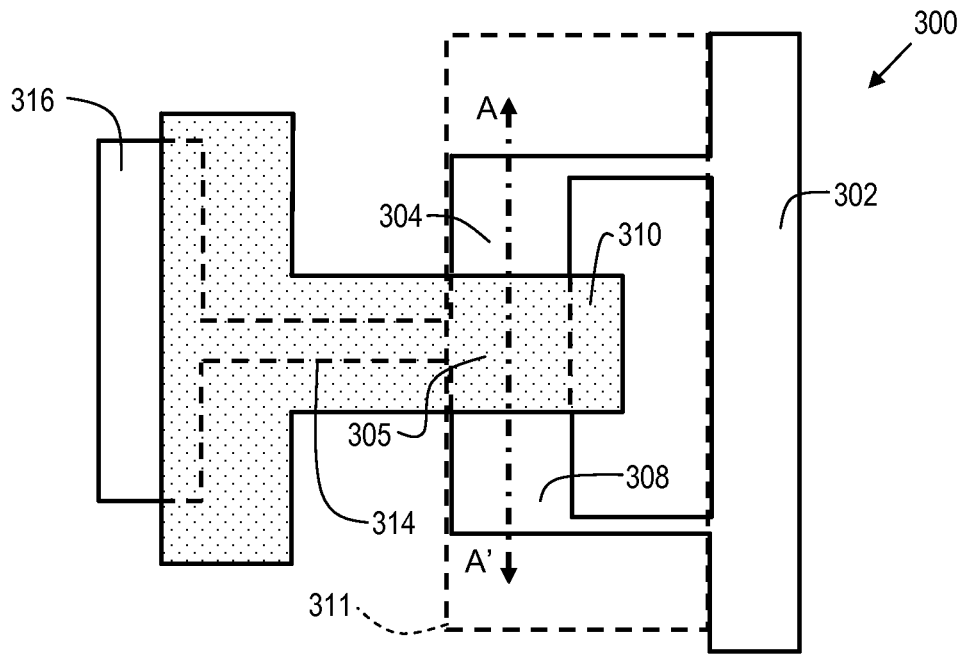

FIG. 3A shows an alternative embodiment of a test structure 300 in accordance with the present invention. Test structure 300 allows the use of VC inspection on PFETs using positive mode (where the surface of test structure 300 is charged positively). Test structure 300 comprises a PFET transistor 311. P+ source region 304 is disposed adjacent to N+ region 305 (underneath gate stack 310), which is in turn disposed adjacent to P+ drain region 308. Therefore, test structure 300 comprises a PFET transistor, with source region 304 and drain region 308 electrically connected to ground bus 302. N+ region 305 is electrically connected to sense pad 316 via body contact 314. The sense pads may be comprised of silicide (a silicon compound such as NiSi, and in which electrons actively flow through), such as when the test structure 300 is used at the silicide module. In an alternative embodiment, the sense pad 316 may be comprised of doped silicon, or another semiconductor, such as germanium.

In cases where the test structure 300 is used after the contact CMP step, the sense pad 316 is preferably comprised of the contact metal, which may include, but is not limited to, tungsten, gold, copper, and aluminum. The entire area of the test structure 300 is first implanted with an N well dopant. After formation of the gate "stack" 310, a P dopant is implanted. The gate stack 310 blocks the P dopants so that the silicon under gate stack 310 remains N doped, hence forming a PFET transistor.

When test structure 300 is charged in positive mode, sense pad 316 will be positively charged, and since sense pad 316 is connected to N+ region 305, a reverse bias is induced between the junction of regions 304 and 305. A similar reverse bias is also induced between the junction of regions 308 and 305. In a normal test structure, sense pad 316 will appear dark on a VC image. In the event of a defect bridging from region 304 or region 308 to region 305, sense pad 316 will be grounded, and hence will appear bright on a VC image. This abnormal pattern is flagged by image analyzing software as a defect.

Figure 3B:
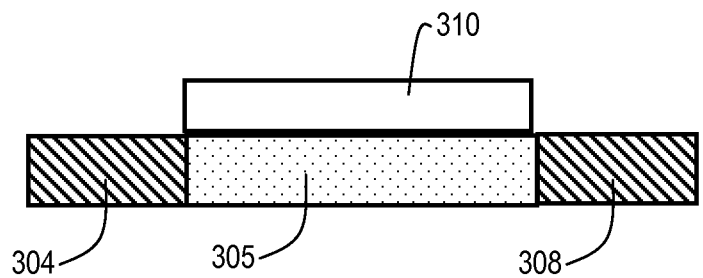

FIG. 3B shows a cross section view of test structure 300 as viewed along line A-A' of FIG. 3A. In this view; gate 310 is shown above N+ region 305, which comprises the "channel" of the PFET transistor. The body contact (314 of FIG. 3A) connects the channel within N+ region 305 to the sense pad (316 of FIG. 3A). If an encroachment defect causes source region 304 and/or drain region 308 to be shorted to N+ region 305, the sense pad will be pulled to ground, and will register as a bright spot within the VC image.

Figure 4:
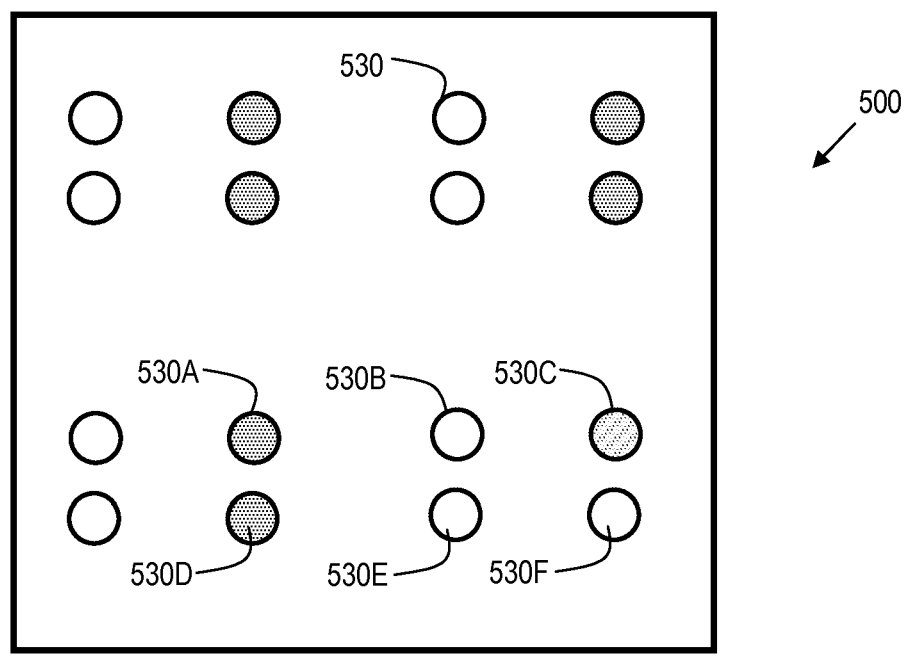

FIG. 4 shows an example of a VC image 500 for when a plurality of structures 300 (see FIG. 3) are inspected after contact CMP. The image shows a plurality of contacts, indicated generally as 530. Each dark contact (such as 530A) represents a sense pad that is "floating" and not connected to ground. Each bright contact (such as 530B) represents a sense pad that is connected to the ground bus. By arranging a plurality of test structures in an array on a wafer, it is possible to create a predetermined pattern, such as an alternating pattern of bright and dark contacts in the VC image. For example, the pattern represented by spots 530A, 530B, and 530C is a dark-light-dark pattern. When a normally dark contact in the pattern is bright, it indicates a defect. This is the case of spot 530F, which is supposed to be dark, similar to spot 530C. Since spot 530F is bright when it is supposed to be dark, this indicates defect that has caused a particular sense pad to be grounded.

The defect and region surrounding it (typically a small area, on the order of 15×15 microns) can then be extracted with a FIB tool for further analysis. The FIB (focused ion beam) tool is capable of extraction, planar milling, and cross-sectioning, as appropriate, to facilitate inspection of the detected defect.

Once the FIB tool has been used to inspect and/or extract the defect area, the wafer can continue to be processed. This is a notable advantage over electrical test via probe pads, where an entire wafer may need to be scrapped to perform failure analysis. Therefore, embodiments of the present invention serve to reduce scrap, while still performing inspection for encroachment defects. Furthermore, the inspections are able to be conducted earlier than the electrical tests that use probe pads. In the case of VC imaging, the inspections can take place after the CMP (chemical mechanical polish) step after contact deposition. With an appropriate grounding scheme, the inspection may take place even as early as following the silicide module. Earlier detection of defects allows needed process adjustments to be made earlier in the semiconductor manufacturing run, reducing waste and improving product yield.

Figure 5:
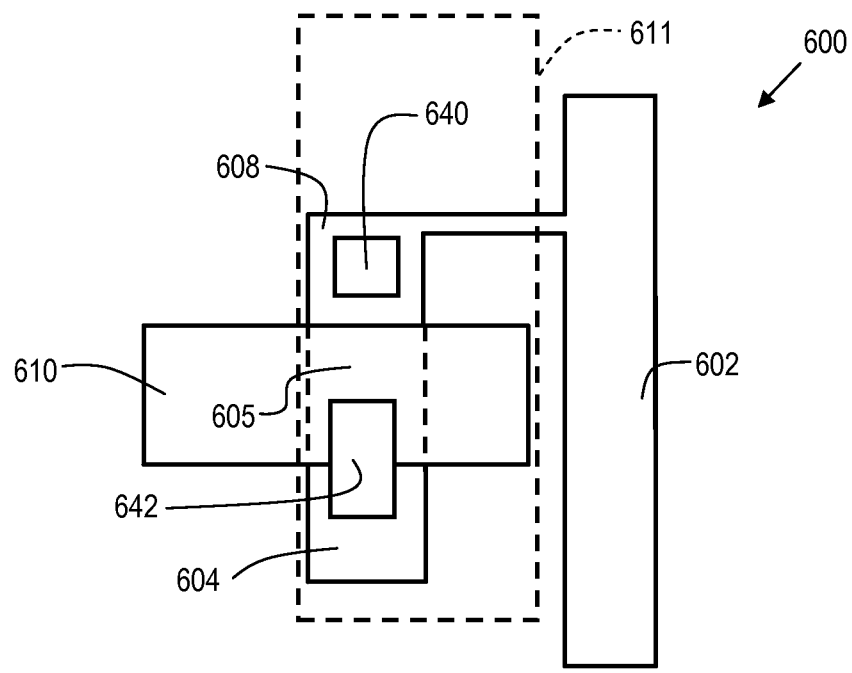

FIG. 5 shows test structure 600, which is an additional alternative embodiment of the present invention. Test structure 600 comprises a PFET transistor 611. In this embodiment, drain region 608 is connected to ground bus 602. Although FIG. 5 shows region 608 connected to the ground bus 602, since the source region 604 and drain region 608 are symmetrical, either region may be connected to ground, without departing from the scope of the present invention. Reference ground contact 640 may be comprised of a metal such as tungsten, and provides access to the ground at the surface after the contact CMP process step. The ground contact 640 is a reference pad, which provides an intentional bright area on the VC image as the inspection works better if some contacts are normally dark and others bright. Source region 604 is electrically connected to gate 610 via rectangular contact 642. Rectangular contact 642 shorts source region 604 to gate 610. In this way, when the surface of test structure 600 is charged positively, the gate 610 will be charged positively along with source region 604, which serves to avoid "false positives" that would occur if the gate 610 were left floating, which may cause the PFET of the test structure 600 to turn on, which would then appear as a defect in the VC image, even though no defect was present. If a defect shorts region 605 to region 608, then region 605 will become grounded and the PN junction from 604 to 605 will be forward biased, essentially grounding region 604. This will result in a bright VC signal for region 642. For this structure rectangular contact 642 serves as the sense pad.

Therefore, test structure 600 comprises two pads, the first pad is a sense pad (rectangular contact 642) that appears normally dark on a voltage contrast image, and the second pad is a reference pad (reference ground contact 640) that appears normally bright on a voltage contrast image. On a defective test structure, both the sense pad and second the reference pad appear bright, enabling the identification of encroachment defects.

Figure 6:
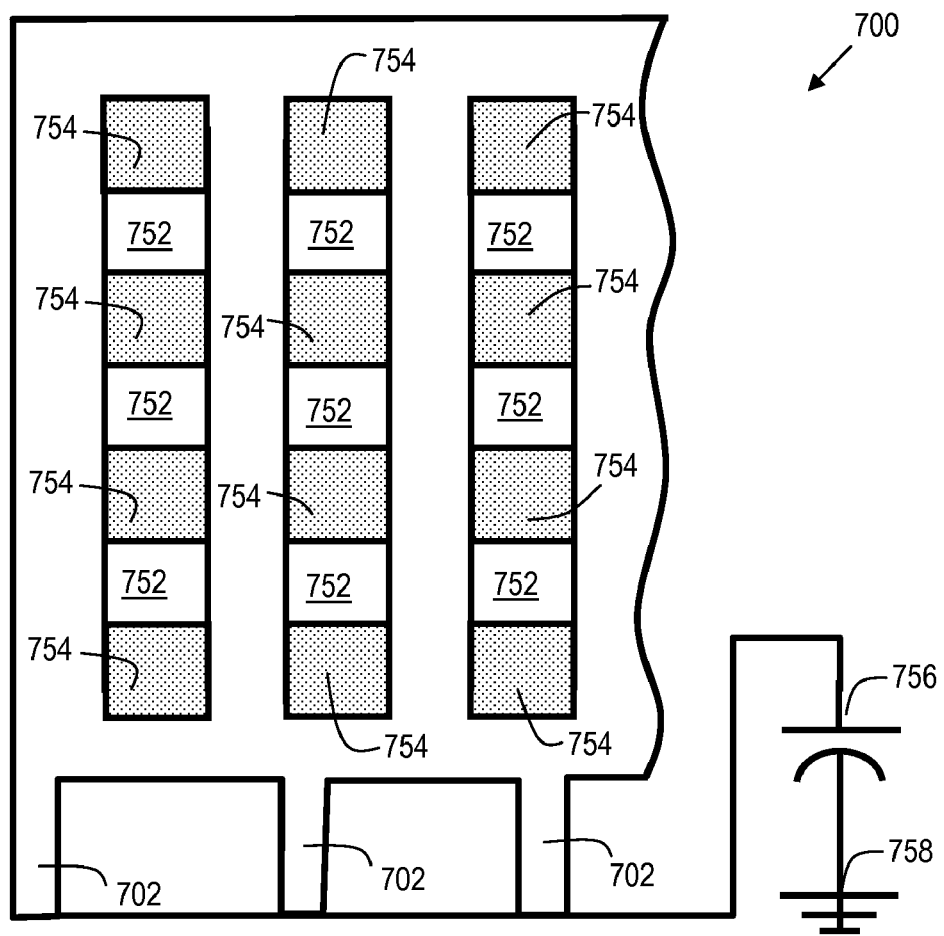

FIG. 6 shows a view of a test array 700 formed on a semiconductor wafer, the test array 700 comprising a plurality of test structures 752 in accordance with the present invention on a wafer. STI (Shallow Trench Isolation) regions 754 are disposed between neighboring test structures 752 to electrically isolate each test structure from neighboring test structures. A plurality of ground busses 702 provides grounding for the test structures 752. Each test structure has its own sense pads, allowing for VC image techniques that can identify a failure in a particular test structure 752.

While some of the previously described test structures allow inspection after the contact CMP process step of the semiconductor manufacturing process, it is possible to perform inspection even earlier. Inspection may be performed as early as after the silicide process step, provided an appropriate grounding scheme is used. In the case of SOI (Silicon on Insulator), working ground busses are not available at the silicide process step. To facilitate VC inspection with SOI at the silicide process step, an alternate grounding scheme may be used. A possible grounding scheme comprises a plurality of large active area or gate stack capacitors (shown schematically as 756) used for grounding so the body contact structure could be inspected at the silicide level. In one embodiment, capacitor 756 is on the order of 10 fF. Each test structure 752 is electrically connected to capacitor 756, which is connected to ground 758. Other grounding schemes are possible, such as those disclosed in U.S. Patent Application Publication number 2007/0221990 to Cote et al., entitled "GROUNDING FRONT-END-OF-LINE STRUCTURES ON A SOI SUBSTRATE" which is incorporated herein by reference.

For bulk technology a substrate contact could be used. The silicide on top of the active area is inspected. In a VC image, grounded silicide appears bright and floating silicide appears dark, similar to the case of a tungsten fill as is the case when the structure is inspected at the contact level. Typically millions of these body contact structures would be arranged in an array that might span 1 mm by 1 mm. A large capacitor covering perhaps 25% of this area could be used for grounding. Each ground bus would tie into this capacitor.

Embodiments of the present invention provide for improved PFET test structures for detecting encroachment defects using VC imaging techniques. The test structures use body contacts, and the PFET components (source, drain, body, and gate) are either grounded, or floating (not connected to other circuitry), depending on the configuration. Some embodiments of the present invention also enable the use of positive mode conditions with PFET test structures, which provides for improved contrast in the VC images, improving the effectiveness of the defect detection achieved with VC imaging.

Although the invention has been shown and described with respect to a certain preferred embodiment or embodiments, certain equivalent alterations and modifications will occur to others skilled in the art upon the reading and understanding of this specification and the annexed drawings. In particular regard to the various functions performed by the above described components (assemblies, devices, circuits, etc.) the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more features of the other embodiments as may be desired and advantageous for any given or particular application.

What is claimed is:

1. A semiconductor test structure comprising:
   a PFET transistor comprising a source region, a drain region, a gate disposed between the source region and the drain region, a body disposed under the gate, and a body contact, wherein the source region and drain region are floating, and wherein the body contact is electrically connected to the body of the PFET transistor and ground, thereby grounding the body of the PFET transistor and, wherein the body contact of the test structure is electrically connected to a capacitor, and wherein the capacitor is electrically connected to ground.

2. The semiconductor test structure of claim 1, wherein the source region and drain region are doped with a dopant selected from the group consisting of boron, indium, and gallium.

3. The semiconductor test structure of claim 1, wherein the body is doped with a dopant selected from the group consisting of phosphorous and arsenic.

4. A semiconductor test structure comprising:
   a PFET transistor comprising a source region, a drain region, a gate disposed between the source region and the drain region, a body disposed under the gate, and a body contact, wherein the body contact is electrically connected to the body of the PFET transistor and to a sense pad, thereby electrically connecting the body of the PFET transistor to the sense pad, and wherein the drain region is electrically connected to ground and to a capacitor, and wherein the capacitor is electrically connected to ground.

5. The semiconductor test structure of claim 4, wherein the sense pad is comprised of silicide.

6. A semiconductor test structure comprising:
   a PFET transistor comprising a source region, a drain region, a gate disposed between the source region and the drain region, and a body disposed under the gate, wherein the source region is electrically connected to the gate, and wherein the drain region is electrically connected to ground, and further comprising a sense pad comprised of a rectangular contact that electrically connects the source region to the gate, and further comprising a reference pad comprised of a reference ground contact, the reference pad electrically connected to the drain region and disposed within the drain region, and also electrically connected to ground.

7. The semiconductor test structure of claim 6, wherein the reference ground contact and rectangular contact are comprised of a metal selected from the group consisting of tungsten, gold, copper, and aluminum, whereby the sense pad appears normally dark on a voltage contrast image, and the reference pad appears normally bright on a voltage contrast image, and on a defective test structure, both the sense pad and reference pad appear bright, thereby enabling defect identification.

8. The semiconductor test structure of claim 6, wherein the body is doped with a dopant selected from the group consisting of phosphorous and arsenic.

9. The semiconductor test structure of claim 6, wherein the source region and drain region are doped with a dopant selected from the group consisting of boron, indium, and gallium.

10. The semiconductor test structure of claim 6, wherein the source of the test structure is electrically connected to a capacitor, and wherein the capacitor is electrically connected to ground.

11. The semiconductor test structure of claim 6, wherein the reference ground contact and rectangular contact are comprised of tungsten, and wherein the body is doped with phosphorous, and wherein the source region and drain region are doped with boron, whereby the sense pad appears normally dark on a voltage contrast image, and the reference pad appears normally bright on a voltage contrast image, and on a defective test structure, both the sense pad and reference pad appear bright, thereby enabling defect identification.

12. A semiconductor test structure comprising:
   a PFET transistor comprising a source region, a drain region, a gate disposed between the source region and the drain region, a body disposed under the gate, and a body contact, electrically connected to the body of the PFET transistor, and to a sense pad, thereby electrically connecting the body of the PFET transistor to the sense pad, and wherein the sense pad is exposed to a surface of the semiconductor test structure, and wherein the source region and the drain region are both electrically connected to ground.

* * * * *